United States Patent [19]
Ma et al.

[11] Patent Number: 6,040,608
[45] Date of Patent: *Mar. 21, 2000

[54] FIELD-EFFECT TRANSISTOR FOR ONE-TIME PROGRAMMABLE NONVOLATILE MEMORY ELEMENT

[75] Inventors: Manny K. F. Ma; Rajesh Somasekharan; Wen Li, all of Boise, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 08/964,164

[22] Filed: Nov. 4, 1997

Related U.S. Application Data

[62] Division of application No. 08/652,376, May 23, 1996, Pat. No. 5,834,813.

[51] Int. Cl.[7] .................................................. H01L 29/68
[52] U.S. Cl. ........................ 257/390; 257/391; 257/392; 257/393; 257/356
[58] Field of Search ..................................... 257/321, 324, 257/349, 347, 350, 355, 356, 360, 368, 530, 901, 390–393; 365/185

[56] References Cited

U.S. PATENT DOCUMENTS

| | | | |
|---|---|---|---|
| 4,087,795 | 5/1978 | Rossler | 365/185 |
| 4,435,788 | 3/1984 | Kitagawa et al. | 365/185 |
| 5,282,158 | 1/1994 | Lee | 365/96 |
| 5,286,992 | 2/1994 | Ahrens et al. | 257/409 |
| 5,428,237 | 6/1995 | Yuzurihara et al. | 257/349 |
| 5,535,158 | 7/1996 | Yamagata | 365/185 |
| 5,554,553 | 9/1996 | Harari | 437/43 |
| 5,793,090 | 8/1998 | Gardner et al. | 257/344 |

*Primary Examiner*—Fetsum Abraham
*Attorney, Agent, or Firm*—Schwegman, Lundberg, Woessner & Kluth P.A.

[57] ABSTRACT

A least one one-time programmable nonvolatile (NV) memory element uses a field-effect transistor (FET) as a selectively programmed element. A short duration applied drain voltage exceeding the FET's drain-to-source breakdown voltage results in a drain source resistance which is substantially unaffected by the voltages typically applied at the gate terminal. Since the programmed resistance is less than 200 ohms and a high programming voltage is not required, the present invention compares favorably with antifuse nonvolatile memory techniques. The nonvolatile memory element is implemented without adding complexity to a very large scale integrated (VLSI) circuit process.

40 Claims, 2 Drawing Sheets

FIELD-EFFECT TRANSISTOR FOR ONE-TIME PROGRAMMABLE NONVOLATILE MEMORY ELEMENT

This application is a division of U.S. patent application Ser. No. 08/652,376, filed May 23, 1996, U.S. Pat. No. 5,834,813, Nov. 10, 1998.

THE FIELD OF THE INVENTION

The present invention relates to semiconductor integrated circuits and, more particularly, the implementation of a one-time programmable (OTP) nonvolatile memory element using a field-effect transistor (FET).

BACKGROUND OF THE INVENTION

During fabrication of very large scale integrated (VLSI) circuit die on a semiconductor wafer, it is desirable to include a one-time programmable (OTP) nonvolatile memory element which can be programmed either during wafer probe or after packaging the die. For example, programming of a OTP nonvolatile memory element is used to provide self-contained identification information about an individual integrated circuit die or die revision. OTP nonvolatile memory is also used for remapping defective dynamic random access memory (DRAM) cell addresses so that functional redundant cells are addressed instead. OTP nonvolatile memory also provides hard-coded digital trimming data for precision analog elements such as bandgap voltage references or other numerous applications where non-volatile data storage is desirable.

There are several ways to implement nonvolatile storage on an integrated circuit die. In one method, fusible links are fabricated in the die. Data is represented in the fusible links by using a laser to selectively trim them, creating open circuits in the fusible links. Laser trimming is difficult and time consuming, involving precise control of the power and position of the focused energy. It is more convenient to electrically program nonvolatile memory during wafer probe without using a laser. Metal fuses exist which can be selectively electrically programmed by exceeding a certain current and thereby creating an open circuit in the fuse.

Antifuses have also been used. They are selectively electrically programmed by applying a programming voltage to break down a dielectric material contacted by two conductive terminals of the antifuse. This permanently changes the resistance presented by the antifuse from a high initial resistance to a low programmed resistance. The programmed resistances typically obtained are on the order of several thousand ohms. In accessing the antifuse for a read operation, the programmed resistance is used, for example, to couple the input capacitance of a logic gate to a high logic level provided by a power supply, or to a low logic level provided by a connection to ground. The time required to charge or discharge the input capacitance of a logic gate is proportional to the product of the programmed resistance of the fuse and the input capacitance of the logic gate. It is desirable to obtain an even lower value of programmed resistance in order to decrease the read access time.

The required programming voltage of an antifuse is quite high, around 11 to 12 volts, and this high programming voltage must be routed to the selected antifuse using other circuits on the integrated circuit chip. Except for routing these high antifuse programming voltages, the other circuits on the integrated circuit chip typically need not be capable of withstanding these high voltages and resulting high electric fields. The introduction of high antifuse programming voltages may require design and process modifications such as tailored junction doping profiles or thick gate oxides in order to avoid damage to the integrated circuit die. Thus, it is desirable to reduce the voltage required for programming a memory element in order to reduce the design constraints on the routing circuits.

Implementation of both fuses and antifuses adds new considerations to an existing integrated circuit process. It is desired to implement a nonvolatile memory element without adding new considerations or complexity to an existing very large scale integrated (VLSI) circuit process.

SUMMARY OF THE INVENTION

The present invention provides a method of programming a nonvolatile memory element on an integrated circuit by applying a differential voltage between a drain terminal and a source terminal of a field-effect transistor (FET) which exceeds a drain-to-source avalanche breakdown voltage characteristic of the FET.

The present invention provides a FET nonvolatile memory element which does not increase the complexity of a conventional integrated circuit process. The present invention teaches a method of selectively programming an array of FETs by applying a programming voltage between the drain terminal and the source terminal of a selected FET which exceeds a characteristic drain-to-source breakdown voltage BVdss, substantially permanently changing the resistance between the drain terminal and the source terminal.

Programming the FET creates a structure having a low resistance between drain and source. The resistance of the programmed structure does not depend on the voltage applied to the gate terminal of the programmed FET. A resistance between drain and source of approximately 160 ohms is obtained from a programmed FET, compared to a resistance on the order of $10^6$ ohms for an unprogrammed FET operated in a cutoff region.

Since read access time increases with a product of the programmed resistance and an input capacitance of sensing circuitry coupled thereto, the read access time of the programmed FET is advantageously decreased from the access time required for reading a programmed antifuse structure.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention uses a field-effect transistor (FET) as a nonvolatile memory element. The FET is programmed by exceeding its characteristic drain-to-source breakdown voltage BVdss. By selectively programming a plurality of FETs, a nonvolatile memory array is implemented.

Figure 1:
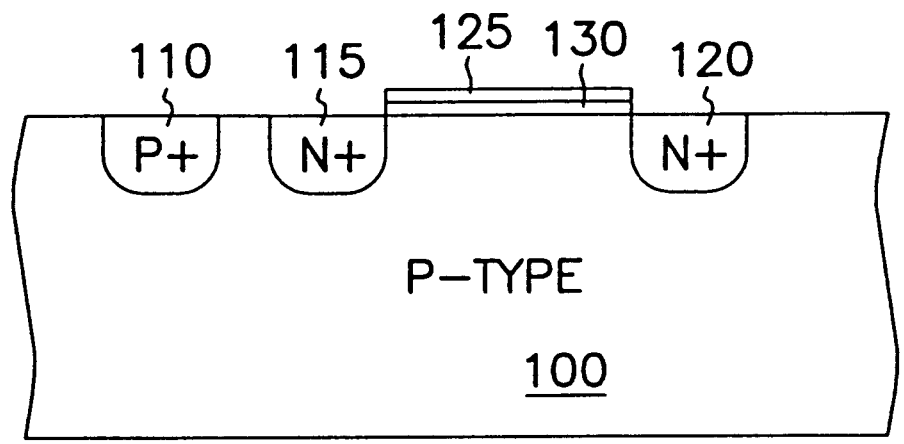
FIG. 1 is a schematic cross-sectional view of an n-channel metal-oxide-semiconductor (NMOS) field-effect transistor (FET).

FIG. 1 illustrates a schematic cross-sectional view of an n-channel metal-oxide-semiconductor (NMOS) FET on and in substrate 100 of p-type doping. It is recognized by one skilled in the art that substrate 100 can also be implemented by a deep p-type doped well diffusion (p-well) in an n-type doped starting material.

The FET includes a body terminal 110 formed from a heavily doped p+ diffusion region making an ohmic contact to substrate 100. The FET also includes a source terminal 115 and a drain terminal 120, both formed from heavily doped n+ diffusion regions. A gate terminal 125, preferably composed of conductively doped polysilicon, is formed on a thin layer of silicon dioxide (gate oxide) 130.

The equations which govern standard large signal operation of NMOS FET are well known, and are not detailed here. See, for example, *CMOS Analog Circuit Design,* by Phillip E. Allen and Douglas R. Holberg, Holt, Rinehart and Winston, Inc., 1987, pp. 95–103.

Figure 2:
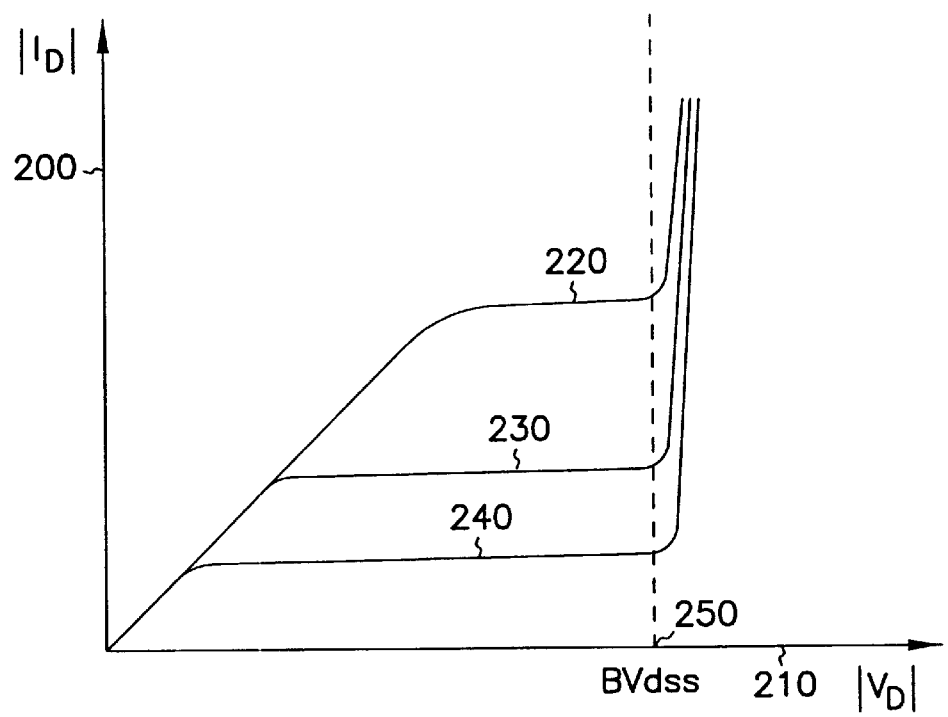
FIG. 2 is a graph of typical drain current magnitude vs. drain voltage magnitude curves for several different voltages applied to the gate terminal of the FET.

FIG. 2 illustrates NMOS FET operation as it is typically described through a family of parameterized curves graphed as drain current magnitude 200 vs. drain voltage magnitude 210 for several different values of gate voltage represented by curves 220,230, and 240. The voltage at source terminal 115 and body terminal 110 are both set at 0V, although a negative voltage can also be applied at the body terminal 110, as discussed below.

In FIG. 2, curve 220 illustrates drain current magnitude 200 vs. drain voltage magnitude 210 for a higher voltage magnitude applied at gate terminal 125 than illustrated in curve 230. Similarly, curve 230 illustrates drain current magnitude 200 vs. drain voltage magnitude 210 for a higher voltage magnitude applied at gate terminal 125 than illustrated in curve 240. Above a characteristic drain breakdown voltage, BVdss 250, the drain current magnitude 200 increases rapidly, as illustrated in each curve 220, 230, and 240. Due to avalanche breakdown, drain voltages 210 above BVdss 250 produce a drain current magnitude 200 which exceeds that described by the standard large signal operation equations.

Avalanche breakdown occurs for voltages applied to drain terminal 120 exceeding BVdss, which is typically between approximately 5V and 10V. Such voltages result in an electric field capable of accelerating electrons to a high enough kinetic energy to break covalent bonds of the silicon lattice thereby freeing electrons for conduction. The electrons thereby freed can also undergo acceleration to a high enough kinetic energy to break more silicon lattice covalent bonds. This carrier multiplication effect results in the drain current magnitude 200 increases illustrated for corresponding drain voltage magnitudes 210 exceeding BVdss 250 in FIG. 2. Ordinarily, integrated circuits are designed such that the logic levels and other voltage signals applied to FETs are below the drain breakdown voltage BVdss. In this way, FETs are typically operated outside the avalanche breakdown region where the drain current magnitude 200 is no longer controlled by the voltage applied at the gate terminal 125.

The present invention intentionally operates selected FETs in the avalanche breakdown region at high drain current magnitude 200 levels, permanently changing the physical characteristics of the FET such that it no longer operates as a resistance between drain and source terminals which is controlled by the voltage at the gate terminal 125. By permanently changing the physical characteristics of selected FETs, they are essentially programmed as desired. Subsequent to such programming, the FET operates instead as a small valued resistance between drain and source terminals which is independent of the voltage at the gate terminal 125.

The permanent reduction in resistance between drain and source terminals of the programmed FET, represents a binary logic value, e.g. a logical 0 or a logical 1. An unprogrammed FET, having an unaltered resistance between its drain and source terminals which is still under control of the voltage at its gate terminal, represents the other binary logic value. By selectively programming an array of FET memory elements in this manner, nonvolatile binary data is stored in the array.

In one embodiment of the present invention, NMOS FETs are selectively programmed as nonvolatile memory elements. By way of a specific example, an NMOS FET having a physical width of approximately 13.7 microns and a drawn length of approximately 0.5 microns may be programmed according to the method of the present invention disclosed below, although a wide variety of other NMOS FET device sizes may also be used. For programming the FET, a voltage of 0V is applied to source terminal 115. A voltage less than or equal to the voltage applied to source terminal 115 is applied to the body terminal 110, this embodiment of the present invention uses −1V applied to body terminal 110. A voltage exceeding the threshold voltage of the FET is applied to gate terminal 125. In one embodiment of the present invention, approximately 4V is applied to gate terminal 125. A programming drain voltage is applied which is sufficiently large to exceed a typical BVdss between 5V and 10V. In one embodiment, a programming drain voltage in the range between 8V and 9V is applied to drain terminal 120 for a duration of approximately 100 ms, causing a drain current magnitude 200 exceeding 50 mA during this time. In one embodiment, the programming drain voltage is generated externally and applied to an input pad on the integrated circuit die for programming during wafer probe.

Thus, the present invention uses a programming drain voltage applied to drain terminal 120 which is lower than the programming voltage required for antifuse nonvolatile memory technology. This reduces the design constraints on other circuitry required to route the programming voltage to the selected nonvolatile memory element.

One embodiment of the present invention uses a FET having a lightly doped drain (LDD) structure typical of FETs with submicron channel length. If a more abrupt junction is used at the interface between drain terminal 120 and substrate 100, the characteristic drain breakdown voltage BVdss 250 is lower, and a lower programming drain voltage is applied to drain terminal 120. The characteristic drain breakdown voltage is typically specified with the voltage at source terminal 115 and the voltage at body terminal 110 both at 0V. The programming drain voltage applied to drain terminal 120 to obtain avalanche breakdown is also lowered by using a FET having a shorter channel length.

In one embodiment of the present invention, an array of NMOS FET nonvolatile data elements is selectively programmed to store binary data which is sensed. To sense the stored binary data, a voltage of 0V is applied to the source terminal 115 and the gate terminal 125 of a selected NMOS FET nonvolatile memory element. The body terminal 110 is held at 0V or at a negative voltage. The difference between voltage at the gate terminal 125 and the voltage at the source terminal 115 does not exceed the threshold voltage required to turn the selected NMOS FET on. At the drain terminal 120, this presents a high resistance on the order of $10^{12}$ ohms if the selected NMOS FET is unprogrammed, and a low resistance of approximately 160 ohms if the selected NMOS FET is programmed. The resistance obtained from a selected programmed NMOS FET will vary significantly in other embodiments based on device parameters, including geometry parameters such as width and length of the NMOS FET, and other parameters such as programming current and time. But the resistance sensed at the drain of a programmed NMOS FET is significantly smaller than the corresponding resistance of an unprogrammed NMOS FET. By sourcing a current to the selected NMOS FET memory element, the difference in programmed and unprogrammed NMOS FET resistances is sensed. The resulting voltage at the drain of a selected programmed NMOS FET will be lower than the corresponding voltage of a selected unprogrammed NMOS FET. In one embodiment, the resulting voltage is compared to a reference voltage between the voltage expected from a programmed FET and the voltage expected from an unprogrammed FET. The result of the comparison represents the binary data obtained from the selected FET.

Figure 3:
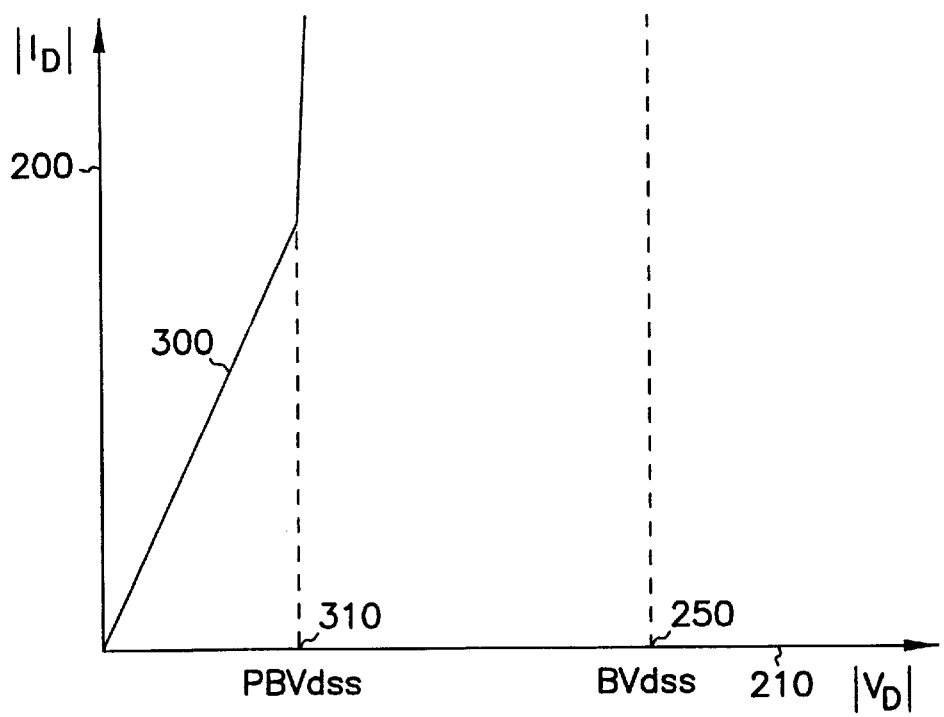
FIG. 3 is a schematic illustration of the drain current magnitude vs. drain voltage magnitude after the FET is programmed.

The low value of FET programmed resistance of approximately 160 ohms is advantageously much less than the 1000 ohms typically obtained from the programmed resistance of an antifuse. The low value of FET programmed resistance is particularly advantageous since the present invention also has a smaller layout area and lower programming voltage than an antifuse. Since read access time of a programmed FET increases with the product of programmed resistance and the input capacitance of a sensing circuit, the programmed FET element allows faster read access time than the programmed antifuse element FIG. 3 illustrates programmed FET curve 300. The low value of programmed resistance of 160 ohms corresponds to the inverse slope of the programmed FET curve 300 for drain voltage magnitudes 210 less than a programmed drain breakdown voltage PBVdss 310. Programmed drain breakdown voltage PBVdss 310 has been reduced from the unprogrammed drain breakdown voltage 250 during the programming of the FET. For the programmed FET, the programmed resistance is even lower for drain voltages 210 exceeding PBVdss 310. Programmed FET curve 300 is independent of voltage applied at gate terminal 125.

Figure 4:
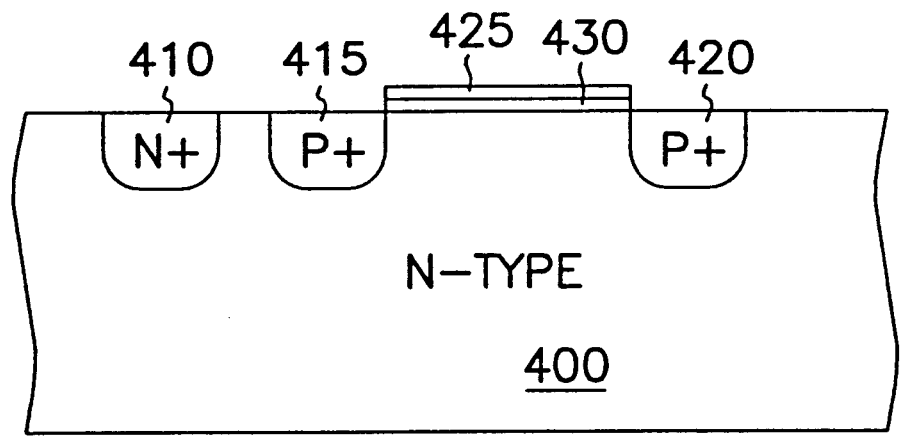
FIG. 4 is a schematic cross-sectional view of a p-channel metal-oxide-semiconductor (PMOS) field-effect transistor (FET).

P-channel metal-oxide-semiconductor (PMOS) FETs can also be used as nonvolatile memory elements. FIG. 4 illustrates a schematic cross-sectional view of a PMOS FET on and in substrate 400 of n-type doping. It is recognized by one skilled in the art that substrate 400 can also be implemented by a deep n-type doped well diffusion (n-well) in a p-type doped starting material. The PMOS FET includes a body terminal 410 formed from a heavily doped n+ diffusion region making an ohmic contact to substrate 400. The PMOS FET also includes a source terminal 415 and a drain terminal 420, both formed from heavily doped p+ diffusion regions. A gate terminal 425, preferably composed of conductively doped polysilicon, is formed on a thin layer of gate oxide 430.

Programming the PMOS FET is analogous to programming the NMOS FET. A positive voltage is applied to source terminal 415. A voltage greater than or equal to the voltage applied to the source terminal 415 is applied to the body terminal 410. A voltage is applied at gate terminal 425 which is more negative than the voltage applied at source terminal 415. The magnitude of the voltage difference between source terminal 415 and gate terminal 425 exceeds the magnitude of the threshold voltage of the PMOS FET. The programming voltage applied to the drain terminal 420 is more negative than the voltage applied to the source terminal 415. The magnitude of the voltage difference between source terminal 415 and drain terminal 420 during programming should exceed the magnitude of the characteristic drain breakdown voltage BVdss of the PMOS FET for a duration of approximately 100 ms.

As with the NMOS FET, programming of the PMOS FET changes its characteristics such that the PMOS FET no longer operates as a resistance controlled by the voltage at the gate terminal 425. Subsequent to programming, the PMOS FET operates instead as a small valued resistor which is independent of the voltage at the gate terminal 425.

In one embodiment, the difference in resistance between a programmed and unprogrammed selected PMOS FET can be sensed by applying a positive power supply voltage to the source terminal 415 and the gate terminal 425 of a selected PMOS FET, and sinking a current from its drain terminal 420. The resulting voltage at drain terminal 420 of the selected PMOS FET will be more positive if it is programmed than if it is not programmed.

It is recognized by one skilled in the art that the specific embodiments of the FET nonvolatile memory elements disclosed by the present invention may be implemented in a variety of different ways without departing from the scope and spirit of the present invention. For example, the drawn width or drawn length of the nonvolatile FET element could be varied, or multiple parallel-coupled FET elements could be used. Such variations, together with the scaling downward of device dimensions as VLSI circuit technology progresses, may lead to variations in programming conditions used to obtain avalanche breakdown and variations in the resulting programmed resistance as well.

Thus, the present invention uses a field-effect transistor (FET) as a nonvolatile memory element which is programmed by exceeding the characteristic drain-to-source breakdown voltage BVdss of the FET. By selectively programming a plurality of nonvolatile memory elements, a nonvolatile memory array is implemented. Since the present invention uses conventional FETs to implement nonvolatile memory elements, no additional process complexity is introduced. The nonvolatile memory array disclosed is therefore implementable on an integrated circuit die together with a dynamic random access memory (DRAM). By selectively programming the nonvolatile memory, defective DRAM cell addresses can be remapped to functional redundant DRAM cell addresses by known techniques.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the electrical, computer, and telecommunications arts will readily appreciate that the present invention may be implemented in a very wide variety of embodiments. This application is intended to cover any adaptations or variations of the preferred embodiment discussed herein. Therefore, it is manifestly intended that this invention be limited only by the claims and the equivalents thereof.

What is claimed is:

1. An integrated circuit programmed nonvolatile memory element comprising:
a field-effect transistor (FET) having drain and source terminals, an electrically interconnected gate terminal that is substantially adjacent to the substrate and separated therefrom by an insulator, and a body terminal, wherein the FET has been programmed such that a channel region has a crystalline lattice stricture which has been permanently altered by temporarily applying a differential drain-to-source programming voltage that exceeds a characteristic drain-to-source avalanche breakdown voltage magnitude (Bvdss).

2. The integrated circuit programmed nonvolatile memory element of claim 1, wherein the interconnected gate terminal is a non-floating gate terminal.

3. The integrated circuit programmed nonvolatile memory element of claim 1, wherein the FET has a lightly doped drain (LDD) structure.

4. The integrated circuit programmed nonvolatile memory element of claim 1, wherein the body terminal of the FET includes a channel which is less than 1 micrometer ($\mu$m) in length.

5. The integrated circuit programmed nonvolatile memory element of claim 1, wherein the FET is a p-channel FET.

6. The integrated circuit programmed nonvolatile memory element of claim 1, wherein the FET is an n-channel FET.

7. The integrated circuit programmed nonvolatile memory element of claim 1, wherein the drain-to-source resistance through the body terminal is less than approximately 1000 ohms.

8. The integrated circuit programmed nonvolatile memory element of claim 1, wherein drain-to-source resistance through the body terminal is approximately 160 ohms.

9. An metal-oxide-semiconductor field-effect transistor (MOSFET) on a substrate, comprising:
a drain terminal;
a source terminal;
a body region located between the drain terminal and the source terminal; and
a gate terminal which opposes the body region and separated therefrom by an insulator, wherein MOSFET has been programmed such that a channel region has a crystalline lattice structure which has been permanently altered by temporarily applying and then releasing a differential drain-to-source programming voltage that exceeds a characteristic drain-to-source avalanche breakdown voltage magnitude (Bvdss) such that the body region operates as a small valued resistance between the drain and the source terminals.

10. The MOSFET of claim 9, wherein the small valued resistance between the drain and the source terminals is independent of the voltage at the gate.

11. The MOSFET of claim 9, wherein the MOSFET has a lightly doped drain (LDD) structure.

12. The MOSFET of claim 9, wherein the body region of the MOSFET includes a channel which is less than 1 micrometer ($\mu$m) in length.

13. The MOSFET of claim 9, wherein the MOSFET is a p-channel MOSFET.

14. The MOSFET of claim 9, wherein the MOSFET is an n-channel MOSFET.

15. The MOSFET of claim 9, wherein the drain-to-source resistance through the body region is less than approximately 1000 ohms.

16. The MOSFET of claim 9, wherein drain-to-source resistance through the body region is approximately 160 ohms.

17. The MOSFET of claim 9, wherein the MOSFET has been programmed by applying a differential drain-to-source programming voltage in the range of between approximately 5 volts and 10 volts.

18. The MOSFET of claim 9, wherein the MOSFET has been programmed by applying a differential drain-to-source programming voltage in the range of between approximately 5 volts and 10 volts for a duration of approximately 100 milliseconds (ms).

19. The MOSFET of claim 9, wherein MOSFET has been programmed by applying a differential drain-to-source programming voltage of 8 volts.

20. An metal-oxide-semiconductor field-effect transistor (MOSFET) on a substrate, comprising:
a drain terminal;
a source terminal;
a body region which includes a channel length of less than 1 $\mu$m, wherein the body region is located between the source and the drain terminals and includes a channel region which has a crystalline lattice structure which has been permanently altered by temporarily applying a differential drain-to-source programming voltage that exceeds a characteristic drain-to-source avalanche breakdown voltage magnitude (Bvdss) such that the drain-to-source resistance through the channel is less than approximately 1000 ohms; and
a gate terminal which opposes the body region and separated therefrom by an insulator.

21. A programmable memory array on a substrate, comprising:
a number of wordlines, wherein each wordline is coupled to a gate terminal which is opposite to a body region located between a source terminal and a drain terminal in a number of metal-oxide-semiconductor field-effect transistors (MOSFETs), and wherein at least one body region has been programmed such that a channel region in the body region has a crystalline lattice structure which has been permanently altered by temporarily applying and then releasing a differential drain-to-source programming voltage such that the drain-to-source resistance through the body region is less than approximately 1000 ohms;
a number of bitlines, wherein each bitline is coupled to a first source/drain terminal of the MOSFETs; and
a number of sourcelines, wherein each sourceline is coupled to a second source/drain terminal of the MOSFETs.

22. The programmable memory array of claim 21, wherein the array is implemented on an integrated circuit die together with a dynamic random access memory (DRAM).

23. The programmable memory array of claim 21, wherein the drain-to-source resistance through the body region is approximately 160 ohms.

24. The programmable memory array of claim 21, wherein the gate terminal is a non-floating gate terminal.

25. The programmable memory array of claim 21, wherein the resistance through the body region is independent of the voltage at the gate.

26. The programmable memory array of claim 21, wherein the number of metal-oxide-semiconductor field-effect transistors (MOSFETs) have lightly doped drain (LDD) structures.

27. The programmable memory array of claim 21, wherein each body region in the number of metal-oxidesemiconductor field-effect transistors (MOSFETs) includes a channel which is less than 1 micrometer (μm) in length.

28. The programmable memory array of claim 21, wherein the number of metal-oxide-semiconductor field-effect transistors (MOSFETs) are p-channel MOSFETs.

29. The programmable memory array of claim 21, wherein the number of metal-oxide-semiconductor field-effect transistors (MOSFETs) are n-channel MOSFETs.

30. The programmable memory array of claim 21, wherein the at least one programmed body region has been programmed by applying a differential drain-to-source programming voltage, wherein the magnitude of the voltage difference between the source voltage and the drain voltage approximately exceeds a characteristic drain-to-source avalanche breakdown voltage magnitude (Bvdss).

31. The programmable memory array of claim 30, wherein the differential drain-to-source programming voltage is in the range of between approximately 5 volts and 10 volts.

32. The programmable memory array of claim 30, wherein the differential drain-to-source programming voltage is 8 volts, and wherein the differential drain-to-source programming voltage is applied for a duration of approximately 100 milliseconds (ms).

33. A programmed Field Effect Transistor nonvolatile memory element, comprising:

a field-effect transistor (FET) having drain and source terminals, an electrically interconnected gate terminal that is substantially adjacent to the substrate and separated therefrom by an insulator, and a gate channel region having been permanently altered through a programming voltage applied between the source region and the drain region and then released, wherein the programming voltage is in excess of the avalanche limit of the channel to produce therefrom a channel resistance lower than the channel resistance of an unprogrammed FET.

34. A programmed nonvolatile FET memory element, comprising:

a source terminal;

a drain terminal;

gate terminal between the source terminal and the drain terminal; and a channel insulted from the gate terminal and located between the source terminal and the drain terminal and having a crystallin lattice structure permanently altered to pass current without applying a voltage to the gate terminal by a programming voltage applied between the source region and the drain region until the crystallin lattice was permanently altered.

35. A programmed nonvolatile FET memory element, comprising:

a source terminal;

a drain terminal;

gate terminal between the source terminal and the drain terminal; and a channel insulted from the gate terminal and located between the source terminal and the drain terminal and having a crystallin lattice structure permanently altered such that the channel has a resistance of less than 1000 ohms, wherein the crystallin lattice has been permanently altered by temporarily applying a programming voltage between the source region and the drain region.

36. A programmed nonvolatile FET memory element, comprising:

a source terminal;

a drain terminal;

gate terminal between the source terminal and the drain terminal; and a channel insulted from the gate terminal and located between the source terminal and the drain terminal and having a crystallin lattice structure which has been permanently altered by temporarily applying and then disconnecting a differential drain-to-source programming voltage that exceeds a characteristic drain-to-source avalanche breakdown voltage magnitude (Bvdss) such that the drain-to-source resistance through the channel is less than approximately 1000 ohms.

37. A programmed memory array on a substrate, comprising:

a number of wordlines, wherein each wordline is coupled to a gate terminal which is opposite to a body region located between a source terminal and a drain terminal in a number of metal-oxide-semiconductor field-effect transistors (MOSFETs), and wherein at least one body region has been programmed, wherein the at least one programmed body region has been programmed by temporarily applying and then disconnecting a differential drain-to-source programming voltage that exceeds a characteristic drain-to-source avalanche breakdown voltage magnitude (Bvdss) such that the drain-to-source resistance through the body region is less than approximately 1000 ohms;

a number of bitlines, wherein each bitline is coupled to the drain terminal of the MOSFETs; and a number of sourcelines, wherein each sourceline is coupled to a source terminal of the MOSFETs.

38. A programmed memory array on a substrate, comprising:

a number of nonvolatile memory elements, each nonvolatile memory element having a source region, a drain region, and a gate opposing a channel region, wherein at least one nonvolatile memory element has a crystallin lattice structure which has been permanently altered by temporarily applying and then disconnecting a differential drain-to-source programming voltage that exceeds a characteristic drain-to-source avalanche breakdown voltage magnitude (Bvdss) such that a drain-to-source resistance through the channel region is less than approximately 1000 ohms;

a number of sourcelines, wherein each sourceline is coupled to a source region for the number of nonvolatile memory elements;

a number of wordlines, wherein each wordline is coupled to a gate of the number of FETs; and a number of bitlines, wherein each bitline is coupled to a drain region for the number of nonvolatile memory elements.

39. A programmed memory device, comprising:

a number of field effect transistors (FETs), each FET having a source region, a drain region, and a gate opposing a channel region;

a number of nonvolatile memory elements, each nonvolatile memory element having a source region, a drain region, and a gate opposing a channel region, wherein at least one nonvolatile memory element has a crystallin lattice structure which has been permanently altered by applying and then releasing a differential drain-to-source programming voltage that exceeds a characteristic drain-to-source avalanche breakdown voltage magnitude (Bvdss) such that a drain-to-source resistance through the channel region is less than approximately 1000 ohms;

a number of sourcelines, wherein each sourceline is coupled to a source region for the number of nonvolatile memory elements;

a number of wordlines, wherein each wordline is coupled to a gate of the number of FETs; and a number of bitlines, wherein each bitline is coupled to a drain region for the number of nonvolatile memory elements and to a drain region for the number of FETs.

40. A programmed integrated circuit, comprising:

a number of dynamic random access memory (DRAM) cells, wherein each DRAM cell includes a field effect transistor (FET) having a source region, a drain region, and a gate opposing a channel region, and wherein each DRAM cell includes a capacitor coupled to the source region of the FET;

a number of nonvolatile access transistors, each nonvolatile access transistor having a source region, a drain region, and a gate opposing a channel region, wherein at least one nonvolatile access transistor has a channel region having a crystallin lattice structure permanently altered to pass current without applying a voltage to the gate, wherein the crystallin lattice structure has been permanently altered by a programming voltage applied between the source region and the drain region until the crystallin lattice was permanently altered;

a number of sourcelines, wherein each sourceline is coupled to a source region for the number of nonvolatile access transistors;

a number of wordlines, wherein each wordline is coupled to a gate of the number of FETs; and a number of bitlines, wherein each bitline is coupled to a drain region for the number of nonvolatile access transistors and to a drain region for the number of FETs.

* * * * *